(12) United States Patent  
Loh et al.

(10) Patent No.: US 6,492,725 B1
(45) Date of Patent: Dec. 10, 2002

(54) CONCENTRICALLY LEADED POWER SEMICONDUCTOR DEVICE PACKAGE

(75) Inventors: Ban Poh Loh, San Jose, CA (US); Douglas P. Woolverton, Mt. View, CA (US); Wayne L. Snyder, Palo Alto, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/498,311

(22) Filed: Feb. 4, 2000

(51) Int. Cl.⁷ .............................................. H01L 23/48
(52) U.S. Cl. ..................... 257/723; 257/724; 257/79; 257/99
(58) Field of Search ................................ 257/723, 724, 257/79–93, 99

(56) References Cited

U.S. PATENT DOCUMENTS

| | | | |
|---|---|---|---|
| 3,512,027 A | 5/1970 | Kupsky | 313/108 |
| 3,614,550 A | * 10/1971 | Marinace et al. | 237/234 R |
| 4,742,432 A | 5/1988 | Thillays et al. | 361/400 |
| 5,029,968 A | * 7/1991 | Geiser, Jr. et al. | 350/96.2 |
| 5,121,188 A | * 6/1992 | Patridge et al. | 357/74 |

FOREIGN PATENT DOCUMENTS

| | | | |
|---|---|---|---|
| DE | 1 589 274 | 3/1970 | .......... H05B/33/16 |
| JP | 55011356 | * 7/1978 | .................. 257/99 |
| JP | 55 011356 | 1/1980 | .......... H01L/33/00 |
| JP | 58222578 | * 6/1982 | .................. 257/99 |
| JP | 58 222578 | 12/1983 | .......... H01L/33/00 |

* cited by examiner

Primary Examiner—Jerome Jackson
Assistant Examiner—Lourdes Cruz
(74) Attorney, Agent, or Firm—Patent Law Group LLP; Rachel V. Leiterman

(57) ABSTRACT

A concentrically leaded power semiconductor package includes two or more generally concentric conductors. An inner conductor may provide an attachment point for one or more semiconductor devices at an end of the inner conductor and an electrical connection at an opposite end. An outer conductor may be pressed onto the inner conductor and may be separated by an electrical insulator. A semiconductor device, such as a light emitting diode (LED), may be attached to the inner conductor by epoxy gluing or by soldering, and may be attached to the outer conductor by a bonding wire. The package may be cylindrical or a rectangular solid. The package may incorporate additional semiconductor mounting surfaces and more than two conductors.

20 Claims, 5 Drawing Sheets

CONCENTRICALLY LEADED POWER SEMICONDUCTOR DEVICE PACKAGE

TECHNICAL FIELD

The technical field is packaged designs for mounting semiconductor devices.

BACKGROUND

Current packages for semiconductor devices, such as light emitting diodes (LED) may be "through the hole" or surface mount types. These packages are used with printed circuit boards (PCBs) and may require a specialized assembly process to securely mount a semiconductor device into the PCB. A soldering process is then applied to electrically and thermally connect the semiconductor leads to the PCB. In the case of a LED, this PCB connection method allows an LED inside the package to be powered and lighted up.

Current LED packages have either flimsy leads (lead frame platform) or no leads (PCB platform—that utilizes plated gold or tin traces as conducting paths) for connecting to the PCB or hard wires. These current LED packages inherently offer very poor thermal spreading and conducting characteristics for removing heat generated by the LED chip inside the LED package. Hence, current LED packages seldom operate at power more than 0.3 watts.

Current LED packages also suffer from other defects including a large package footprint. Where flux per package per footprint area is a factor, for example illumination inside an instrument panel, current LED packages are difficult to apply. Also, existing LED packages may be too large to form close clusters of different color LEDs inside a reflective (mixing) chamber, to obtain specific spectral effects and luminous efficiency.

SUMMARY

A concentrically leaded power semiconductor device package eliminates problems inherent in current semiconductor package designs. The package offers the possibility to avoid or minimize the use of soldering processes in the application assembly. The package also provides for superior heat dissipation. The package comprises a pair of coaxial round or square wire leads, which are electrically separated by a thin dielectric film. The package does not need to be mounted on a PCB to be powered up. Leads from the package may be securely mounted on a low cost connector, which may be designed to also function as a heat sink, by simply plugging the package into the connector. As the connector supplies power to the LED, the connector also removes heat generated by the LED. The package delivers excellent thermal spreading and conducting properties to LEDs packaged inside. This may be achieved by attaching the LED chips on the end face of a straight wire (inner) at one end and allowing an opposite end of the same wire to be inserted into the heat sink in an application assembly. Alternatively, an outer wire, or conductor, may be inserted into the heat sink. The wire diameter and material selection may be based on a thermal performance of the LED chip package. A thermal compound or grease may be used to reduce the thermal resistance at the interface between the cylindrical surfaces of the inner wire and the heat sink of the connector. This design scheme allows a high-power LED to be packaged and operated at high wattage without overheating.

In addition to a coaxial cylindrical or square design, the package may incorporate multiple layers of coaxial conductors. For example, the package may include three concentric cylindrical conductors. Such a design allows for the use of multiple LEDs. Other variations of the package configuration may incorporate LEDs and other devices, including semiconductor devices, resistors and capacitors, attached on a cutaway section of one of the semiconductors. This variation of the package design may be useful for a semiconductor laser, for example.

DESCRIPTION OF THE DRAWINGS

The detailed description will refer to the following drawings, in which like numerals refer to like elements, and in which.

DETAILED DESCRIPTION

Figure 1A:
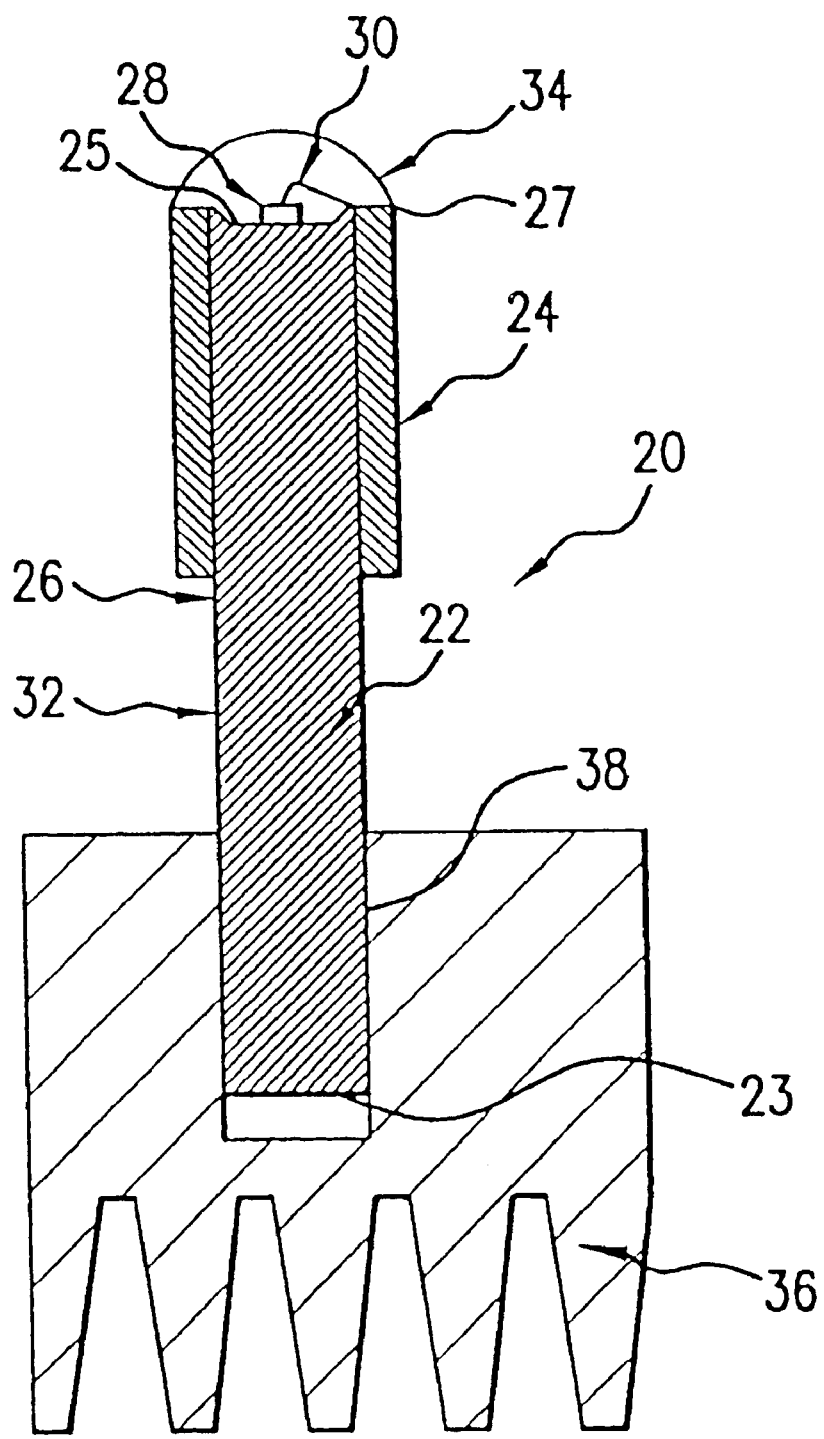
FIG. 1a is a cross-sectional view of a concentrically leaded power semiconductor device package.

FIG. 1a is a cross-sectional view of a concentrically leaded power semiconductor device package design 10. A concentrically leaded power semiconductor device package 20 includes an inner conductor 22, which may be round, square, triangular or any other appropriate shape in cross section. The inner conductor 22 includes an electrical connection end 23 and a mounting surface end face 25 at an opposite end of the inner conductor 22 from the electrical connection end 23. An outer conductor 24 surrounds the inner conductor 22 and generally conforms to the same cross sectional shape as the inner conductor 22. The inner conductor 22 and the outer conductor 24 are separated by an insulation film 26. The insulation film 26 provides electrical insulation between the inner conductor 22 and the outer conductor 24. The insulation film 26 may be a very thin high-temperature dielectric coating, for example.

The inner conductor 22 and the outer conductor 24 may be tightly bonded together with a press fit. The mounting surface 25 of the inner conductor 22 and a corresponding face 27 of the outer conductor 24 may be machined or coined (stamped) to full features designed for die-attaching, wire bonding, and optical performance.

Along a length of the package, the outer conductor 24 may terminate before the inner conductor 22, thus exposing the inner conductor 22 and the insulation film 26. The insulation film 26 may be removed from the inner conductor 22 and the inner conductor 22 may be plated for electrical and thermal contacts. The entire package 20 may be plated with an underlayment of nickel and a top layer of silver, gold or other precious metals 32 for die-attaching, wire bonding, optical reflectivity, electrical and thermal contacts, and corrosion resistance. Selective plating and coating of reflective substances may be used to meet performance objectives.

At the mounting surface 25, FIG. 1a shows a LED chip 28 attached to the inner conductor 22. A bonding wire 30 is used to attach the LED chip 28 to the outer conductor 24. The LED chip 28 may be attached to the inner conductor 22 using standard conducting epoxies or by soldering, for example. Similarly, the bonding wire 30 may be attached to the LED chip 28 and the outer conductor 24 by epoxy or by soldering or standard bonding techniques. The LED chip 28 and bonding wire 30 may be encapsulated using an epoxy dome 34.

Figure 1B:
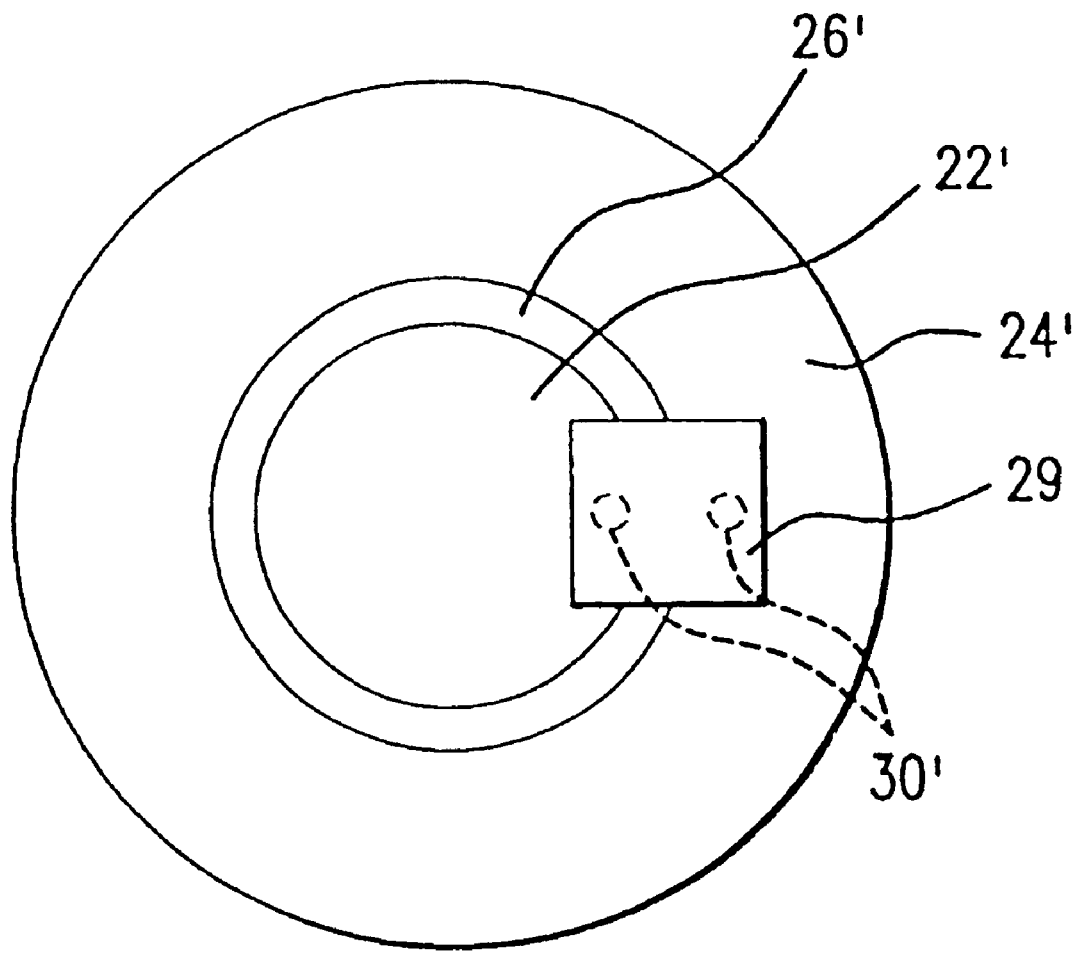
FIG. 1b is a top view of a concentrically leaded power semiconductor package showing an alternate mounting arrangement for a semiconductor device.

In FIG. 1a, the LED chip 28 is shown with the bonding wire 30 as one electrical connection. The LED chip 28 is directly bonded to the inner conductor 22 to form a second electrical connection. Other electrical connection arrangements are possible with the package 20. For example, all electrical connectors from a semiconductor device, such as a computer chip, may be made at a top surface of the semiconductor device. LEDs may also be electrically connected in the package 20 in this fashion. Alternatively, a semiconductor device, such as a LED, with electrical connections normally on its top side, may be flipped over and bonded (e.g., by soldering) directly to the substrate. Such an arrangement (known as a "flip chip") is shown in FIG. 1b, in which a semiconductor device 29 is shown bonded to an inner conductor 22' and an outer conductor 24'. The inner conductor 22' and the outer conductor 24' are shown separated by insulator 26', which provides electrical isolation. The semiconductor device 29 is electrically connected to the inner conductor 22' and the outer conductor 24' at attachment points 30'. The semiconductor device 39 may be attached by soldering or epoxy gluing, for example.

The design 10 is shown with the package 20 inserted into a heat sink 36. The heat sink 36 also acts as an electrical connector for the inner conductor 22. A return electrical source (not shown in FIG. 1a) attaches to the outer connector 24. The package 20 may be easily inserted into the heat sink 36 by pressing, for example. To improve thermal performance, a thermal conducting material 38, such as a thermal grease, may be applied to the electrical connection end 23 of the inner conductor 22 to reduce thermal resistance at the interface between a surface of the inner conductor 22 and the heat sink 36.

In FIG. 1a, the heat sink 36 is shown attached to the inner conductor 22. Alternative means may also be provided to remove heat generated by semiconductor devices mounted in the package 20. For example, a heat sink may be coupled to the outer conductor 24 instead of, or in addition to, connecting the heat source 36 to the inner conductor 22.

The inner conductor 22 may be sized to accommodate special applications. For example, the inner conductor may range in diameter from 0.1 mm to 5 mm or more. The inner conductor 22 and the outer conductor 24 may be formed from any suitable conducting material such as copper, for example.

Because the packages 20 may be very thin, several packages 20, each with a different color LED, may be arranged to produce a mixture of colors. For example, a blue LED and a green LED may be packaged to provide a desired effect of a different colored light. Alternatively, LEDs may be packaged to produce a white light. Because of its superior heat dissipation characteristics, the package 20 may be used to provide general white light illumination from LEDs.

Figure 1C:
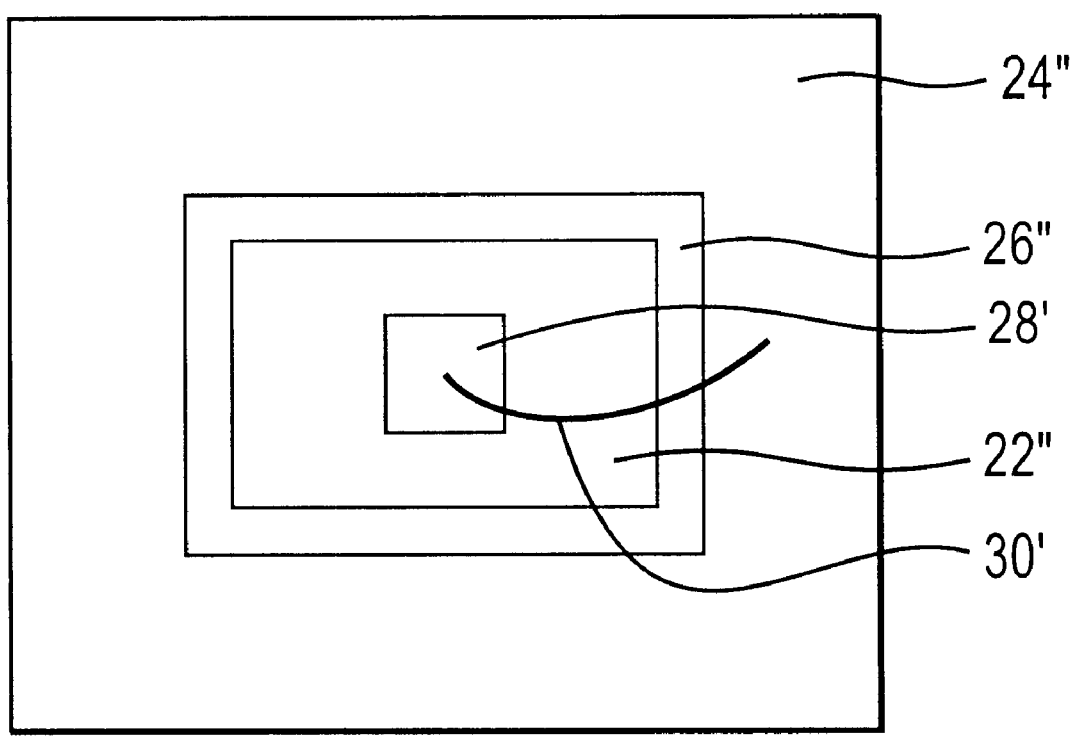

In the example shown in FIG. 1, the LED chip 28 is packaged in the package 20. However, the package 20 may be used with other electrical devices including semiconductor lasers, other power semiconductor devices and other discrete electrical components including resistors, inductors and capacitors.

Additional semiconductor devices may be included in the package 20. In one arrangement, additional LEDs (not shown in FIG. 1a) may be attached to the inner conductor 20. In another arrangement a third conductor (not shown in FIG. 1a) may be arranged concentrically with the outer conductor 24. Semiconductor devices may then be attached to the second conductor 24 and bonded to the inner conductor 22. In this arrangement, the semiconductor device (e.g., the LED chip 28) attached to the inner conductor 24 could be bonded to the third conductor.

In yet another arrangement (not shown in FIG. 1a), fourth and subsequent conductors may be placed concentric with the inner, or first conductor.

Figure 2C:
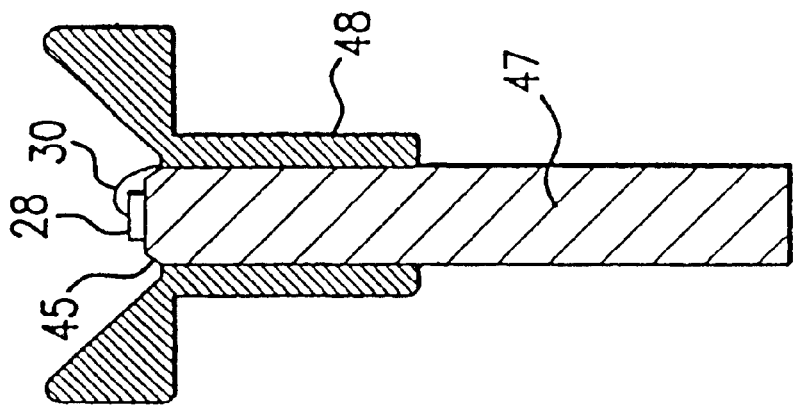
FIGS. 2a–2c illustrate various optical design and bonding features for the package shown in FIG. 1.
Figure 2B:
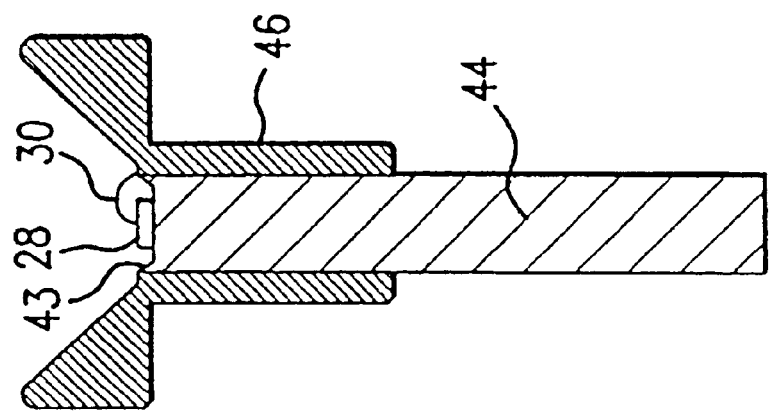
Figure 2A:
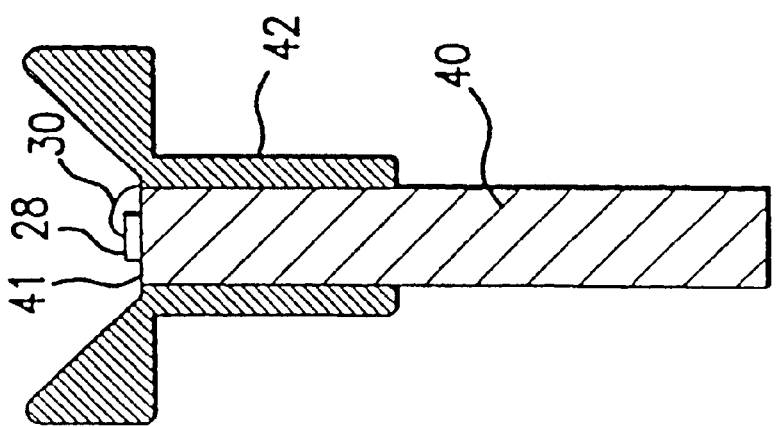

FIGS. 2a–2c illustrate alternative options for the end face 25 of the inner conductor 22 and for attaching the bonding wire 30. As shown in FIGS. 2a–2c, the LED chip 28 is placed at a center of an end face of an inner conductor. Any slight change to the surface area surrounding the LED chip 28 will have a great impact on its luminous distribution. Three different design options for the end face of the inner conductor are possible as illustrated in FIGS. 2a–2c . FIG. 2a illustrates a flat surface 41; FIG. 2b illustrates a reflector cup 43, which is a shallow concave volume to direct luminous flux upward; and FIG. 2c illustrates a pedestal 45, which is a raised surface for the LED chip 28 to allow luminous flux distributed downward giving an illuminated space that is greater than that of a hemisphere.

Also shown in FIGS. 2a–2c are options for attaching the bonding wire 30 to the outer electrode. The LED chip 28 is shown die-attached to a center of the inner conductor. However, the stitch bond position for the bond wire 30 may be anywhere on the end face of the outer conductor, offering a great flexibility to the designer.

Figure 3:
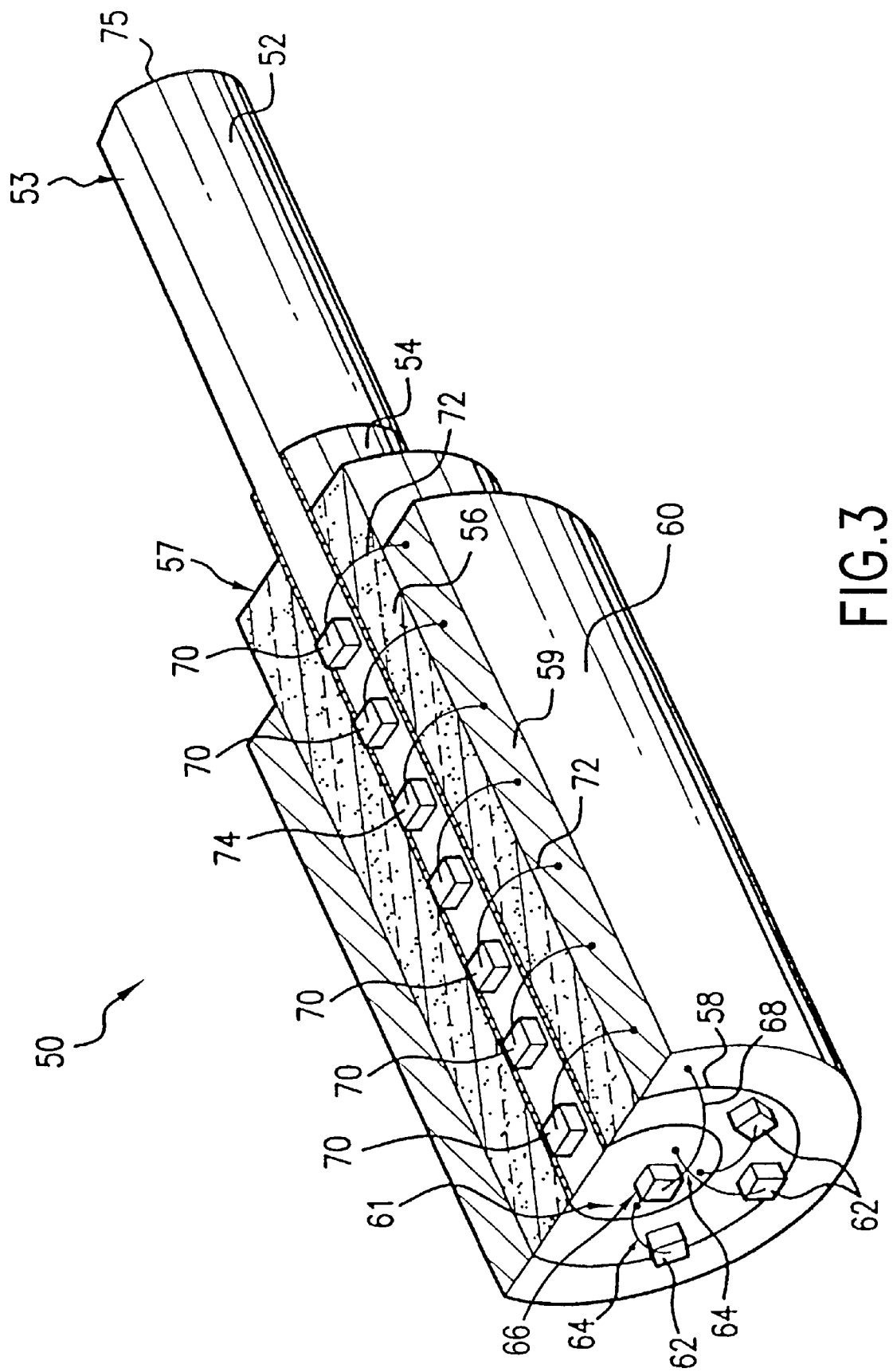
FIG. 3 is an alternate design of a concentrically leaded power semiconductor device package.

FIG. 3 shows an alternate concentrically leaded power semiconductor device package 50. The package 50 includes an inner conductor 52 having a flat face 53 machined longitudinally along its length. An intermediate conductor 56 partially surrounds the inner conductor 52 and is separated from the inner conductor 52 by the insulation layer 54. The intermediate conductor 56 has a machined face 57 that corresponds to the shape of the face 53 of the inner conductor 52. An outer conductor 60 partially surrounds intermediate conductor 56 and is separated from the intermediate conductor 56 by an insulation layer 58. A face 59 of the outer conductor 60 is machined to correspond to the faces 57 and 53 of the intermediate conductor 56 and the inner conductor 52, respectively. As a result of this machining, the flat face 53 is exposed and may be used to mount semiconductor devices or other electrical devices. Thus, the intermediate conductor 56 and the outer conductor 60 as shown in FIG. 3 are only partly concentric with the inner conductor 52.

At a surface mount face 61 of the package 50, semiconductor devices 62, which may be LED chips, are shown mounted on the intermediate conductor 56. Bonding wires 64 attach from the semiconductor devices 62 to the inner conductor 52. A semiconductor device 66 is shown attached to the inner conductor 52 and a bonding wire 68 is shown attached from the semiconductor device 66 to the outer conductor 60. Attached along the flat face 53 of the inner conductor 52 are a number of semiconductor devices 70. Bonding wires 72 attach the semiconductor devices 70 to the outer conductor 60. An electrical component 74, which may be a resistor or a capacitor, for example, is also shown attached to the flat face 53.

Other options are available for attaching semiconductor devices to the package 50. For example, "flip chips" (not shown in FIG. 3) may be soldered or epoxied between the inner conductor 52 and the intermediate conductor 56. Semiconductor devices may be attached on the face 59 of the outer conductor 60 and may then be connected to the inner conductor 52 by a bonding wire.

The package 50 may be particularly useful for applications such as semiconductor lasers because the semiconductor devices 70 may be arranged in a manner that is optimal for laser applications. The package 50 may also be used for other applications besides an LED package. For example, the electrical component 74 in conjunction with the semiconductor devices 70, 62 and 66 may be used to perform many of the functions currently performed by printed circuit boards.

Power for the semiconductor devices shown in the package 50 may be provided by the inner conductor 52 with return electrical paths (not shown) through the intermediate conductor 56 and the outer conductor 60. The inner conductor 52 may also be used to remove heat generated by the semiconductor devices in the package 50 by inserting an end 75 of the inner conductor 52 into an appropriate heat sink (not shown). Alternatively, either or both of the intermediate conductor 56 or the outer conductor 60 may be coupled to a heat sink and may then be used to remove heat. In this alternative arrangement, lengths of the intermediate conductor 56 and the outer conductor 60 may be longer than a length of the inner conductor 52 to facilitate insertion into the heat sink. In this alternative arrangement, the heat sink may also provide an electrical supply to either or both of the intermediate conductor 56 and the outer conductor 60.

The package 50 shown in FIG. 3 is generally cylindrical and comprises three partly concentric conductors. However, the package 50 may be further modified by providing additional mounting faces, similar to the flat face 53, around the periphery of the package 50. Alternatively, additional conductors may be added to the package 50, each additional conductor generally concentric with prior conductors. Furthermore, the electrical arrangement of the conductors of the package 50 may be as shown in FIG. 3 or may be any other arrangement. In yet another alternative, the package 50 may be a rectangular solid, or any other solid, and may be used to mount semiconductor devices and other electrical devices on the surfaces of the conductors. Generally, any coaxial, concentric or symmetrical arrangement of conductors may be used to provide a sturdy semiconductor mounting surface with superior heat dissipation characteristics.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A semiconductor package, comprising:
   a first conductor having a face end and a first length, wherein the face end is one of concave and pedestal;
   a second conductor in external concentric arrangement with the first conductor and having a second length;
   a first insulator disposed between the first conductor and the second conductor; and
   a flip chip semiconductor device affixed to the face end of the first conductor and to the second conductor.

2. A semiconductor package, comprising:
   a first conductor having a face end and a first length;
   a second conductor in external concentric arrangement with the first conductor and having a second length, wherein the first and the second conductors are square in cross-section;
   a first insulator disposed between the first conductor and the second conductor; and
   a flip chip semiconductor device affixed to the face end of the first conductor and to the second conductor.

3. A semiconductor package, comprising:
   a first conductor having a face end and a first length;
   a second conductor in external concentric arrangement with the first conductor and having a second length;
   a first insulator disposed between the first conductor and the second conductor;
   a flip chip semiconductor device affixed to the face end of the first conductor and to the second conductor;
   a third conductor in an external concentric arrangement with the second conductor and having a third length;
   a second insulator separating the third and the second conductors; and
   a second semiconductor device attached to the first conductor and to the third conductor.

4. The semiconductor package of claim 3, wherein the first and the second insulators are a polymer material and wherein exposed surfaces of the first, second, and third conductors are coated with one or more coatings using materials including nickel, silver and gold.

5. The semiconductor package of claim 3, wherein the first conductor includes an exposed flat surface along the first length and an insulated surface along the first length, and wherein the second and third conductors at least partially surround the insulated surface.

6. The semiconductor package of claim 5, further comprising a plurality of electrical devices mounted on the exposed flat surface, each of the plurality of electrical devices bonded to one of the second conductors and the third conductor.

7. The semiconductor package of claim 6, wherein the plurality of electrical devices includes one or more LEDs.

8. The semiconductor package of claim 6, wherein the plurality of electrical devices comprise one or more of a semiconductor laser, a resistor, an inductor, and a capacitor.

9. The semiconductor package of claim 5, wherein the first conductor is generally cylindrical, wherein the insulated surface comprises a curved surface of the cylinder, and wherein the second and the third conductors at least partially surround the curved surface.

10. The semiconductor package of claim 5, wherein the first conductor is a rectangular solid, wherein the insulated surface comprises any three sides of the first conductor along the first length, and wherein the second and third conductors at least partially surround the insulated surface.

11. A semiconductor package, comprising:
    a first conductor having a face end and a first length;
    a second conductor in external concentric arrangement with the first conductor and having a second length;
    a first insulator disposed between the first conductor and the second conductor;
    a flip chip semiconductor device affixed to the face end of the first conductor and to the second conductor; and
    a heat sink having a receptacle, wherein one of the first conductor and the second conductor is pressed into the receptacle, and wherein the heat sink provides electrical power to the pressed-in conductor.

12. A semiconductor package, comprising:
    an inner conductor comprising a first surface for mounting a plurality of semiconductor devices and having a first length;
    one or more outer conductors at least partly concentric along a portion of the length of the inner conductor;
    insulator material disposed between each of the inner and the one or more outer conductors; and a plurality of flip chip semiconductor devices disposed on the first surface.

13. The semiconductor package of claim 12, wherein the inner conductor comprises a second surface for mounting semiconductor devices, the second surface formed along the first length, and further comprising one or more electrical devices disposed on the second surface, wherein the electrical devices comprise one or more of a semiconductor device and a discrete electrical device.

14. The semiconductor package of claim 12, further comprising:
   a heat sink coupled to the inner conductor; and
   an optical coating disposed over one or more of the plurality of semiconductor devices.

15. A coaxial package for mounting flip chip electrical components, comprising:
   an inner conductor, comprising:
      a first surface for mounting the flip chip electrical components; and
      an electrical connection section for coupling the package to an electrical supply;
   a plurality of outer conductors generally externally coaxial with the inner conductor; and
   an electrical insulator disposed between the inner and each of the plurality of outer conductors.

16. The coaxial package of claim 15, wherein the inner conductor is a solid body having end faces and one or more side faces, wherein the first surface is on an end face, wherein the inner conductor comprises a second surface for mounting the electrical components, the second surface formed on one or more of the one or more side faces wherein one or more electrical devices are disposed on the second surface.

17. The coaxial package of claim 15, further comprising:
   a heat sink coupled to one or more of the inner conductor and the plurality of outer conductors;
   one or more electrical devices disposed on the first surface and bonded to the plurality of outer conductors; and
   a conductive coating disposed on exposed surfaces of the inner and the plurality of outer conductors.

18. The semiconductor package of claim 3 wherein the flip chip is directly attached to the face end with no intermediate structure.

19. The semiconductor package of claim 4 wherein the first length and the second length are unequal.

20. The semiconductor package of claim 4 wherein the flip chip is electrically connected to the first and second conductors.

* * * * *